United States Patent [19]

Huh

[11] Patent Number: 5,783,099
[45] Date of Patent: Jul. 21, 1998

[54] ETCH-ENDING POINT MEASURING METHOD FOR VAPOR ETCH PROCESS

[75] Inventor: Yun Jun Huh, Seoul, Rep. of Korea

[73] Assignee: LG Semicon Co., Ltd., Chungcheongbuk-Do, Rep. of Korea

[21] Appl. No.: 679,004

[22] Filed: Jul. 12, 1996

[30] Foreign Application Priority Data

Feb. 28, 1996 [KR] Rep. of Korea ............... 5004/1996

[51] Int. Cl.$^6$ ............... G01R 31/00; H01L 21/268
[52] U.S. Cl. ............... 216/59; 216/61; 438/14; 438/17
[58] Field of Search ............... 216/59, 61; 438/14, 438/17

[56] References Cited

U.S. PATENT DOCUMENTS 4,358,338  11/1982  Downey et al. ............... 438/17
4,362,596  12/1982  Desilets et al. ............... 216/59
4,872,944  10/1989  Rufin et al. ............... 438/14
5,294,280   3/1994  Wakabayashi et al. ............... 216/59

FOREIGN PATENT DOCUMENTS 61-224319  10/1986  Japan ............... 216/61
62-204528   9/1987  Japan ............... 216/61
3-253586   11/1991  Japan ............... 216/59

*Primary Examiner*—Roland Martin
*Attorney, Agent, or Firm*—Morgan, Lewis & Bockius LLP

[57] ABSTRACT

A method for determining an etch-ending point using a vapor etch apparatus having a chamber is disclosed including the steps of providing a vapor-state etchant in the chamber, inserting a material to be etched in the chamber and etching the material by the etchant, measuring an ion current intensity of a by-product generated during the vapor etch process, calculating a thickness variation value of the material by using the ion current intensity value, and stopping the vapor etch process when the thickness variation value reaches a preset value.

16 Claims, 4 Drawing Sheets

ETCH-ENDING POINT MEASURING METHOD FOR VAPOR ETCH PROCESS

BACKGROUND OF THE INVENTION

1. Field of the Invention

The present invention relates to a method for measuring an etch-ending point, and more particularly, to a method for measuring an etch-ending point during a vapor etch process.

2. Discussion of the Related Art

An etching process is usually carried out for forming a variety of patterns during a semiconductor device manufacturing process. It can be used to etch a semiconductor layer, an insulating layer, or a conductive layer. Conventionally, etching processes are classified into processes using either a dry etch method or a wet etch method. Recently, a vapor etch method has been introduced where a material is etched in a chamber filled with a vapor-state etchant.

For the dry etch, the wet etch, and the vapor etch methods, one important factor is the ability to decide when a layer subjected to etching has been etched to the desired thickness. In order to assure the success of the semiconductor device manufacturing process which requires minute patterns, it is essential to be able to decide accurately when each of the layers subjected to etching has been etched to the desired thickness during the etch process for forming the respective patterns. In other words, it is essential to accurately measure an etch-ending point during an etch process.

The conventional methods for measuring an etch-ending point will now be described for both the dry etch process and the wet etch process.

For the dry etch process, the widely adopted etch-ending point measuring method is a light wavelength method. When the dry etch of a silicon oxide layer ($SiO_2$) is performed by using an etchant $CF_4$, the etchant $CF_4$ reacts to the silicon oxide layer to produce a by-product such as $CO_yF_x$. A light beam, such as laser, is then projected upon the silicon oxide layer which is reacting with the etchant $CF_4$. When the light is reflected from the silicon oxide layer and the by-product resulting from the reaction, the intensity of the reflected light at specific wavelengths will vary in accordance with the degree of etching completed of the silicon oxide layer. The intensity of the reflected light at a specific wavelength is measured during the etch process and compared to a certain pre-determined intensity value set by prior experiments. Thus, when the measured intensity of the light is equal to the pre-determined intensity value, the etch-ending point has been reached.

The above described light wavelength method for measuring the etch-ending point is also used in a conventional chemical-mechanical polishing (CMP) process. The CMP process etches a layer to a desired thickness by milling the layer subjected to the etch process.

For the wet etch process, three conventional methods for measuring the etch-ending point are often used. For the purpose of discussion, it is assumed that an insulating layer is wet-etched to form a desired pattern in a structure having the insulating layer on a semiconductor layer.

The first method is a color method. After placing this structure into a bath filled with an etchant and conducting the wet etch for a period of time, the resultant structure is taken out of the bath to determine the etch-ending point by examining the surface color of the resultant structure. If the insulating layer is etched to the desired thickness, the surface color of the structure would differ from that before conducting the etch. This is because the color of the underlying semiconductor layer is different from that of the insulating layer.

This color method is mainly used in a partial etch process. For example, it is used when the insulating layer of 5000Å is etched by 4000Å only.

The second method is a surface tension method. A structure comprised of a semiconductor layer, such as silicon, and an insulating layer is placed in a bath filled with a wet-etchant and subjected to the wet etch. Then, the resultant structure is taken out of the bath and the surface is sprayed with water. If the insulating layer is fully etched, the surface of the silicon would be exposed. Accordingly, water will stay on the silicon surface due to the surface tension of the silicon. If the insulating layer is not fully etched, the sprayed water does not adhere to the surface. Instead, it flows over the surface since the insulating layer has almost no surface tension. Thus, the etch-ending point can be measured.

The third method for determining the etch-ending point uses a thickness meter. Initially, a structure comprised of a semiconductor layer and an insulating layer is placed into the bath and subjected to the wet etch for a period of time. Then, the resultant structure is taken out of the bath, and the thickness of the structure is measured by using a thickness meter. If the insulating layer is fully etched, the measured thickness of the structure equals the thickness of the semiconductor layer. If the insulating layer is not fully etched, the measured thickness of the structure would be larger than the thickness of the semiconductor layer.

For the vapor etch process, a material is etched using a vapor-state etchant, instead of a gas-state etchant. In this sense, the vapor etch process is more similar to the wet etch process than to the dry etch process. Therefore, the conventional etch-ending point measuring methods for the wet etch process are also used for the vapor etch process.

All three etch-ending point measuring methods for the wet etch process are visual methods, which can be difficult to apply when the structure has patterns. Since the etch process employed for manufacturing semiconductor devices is frequently used to form patterns, and the patterns are often of a minute nature, it is almost impossible to visually measure the etch-ending point under those circumstances.

Conventionally, in order to actually apply the above-described methods during the manufacturing process of the semiconductor devices, a test pattern with an enlarged configuration is utilized. In other words, the same manufacturing process is simultaneously performed upon the test pattern when the process is used to manufacture the semiconductor devices. The test pattern is a considerable enlargement of the actual structure, so that the above three etch-ending point measuring methods can be applied. The etch-ending point of the actual structure can be only estimated by using the color, surface tension, and thickness of the test pattern.

This technique of using the etch-ending point on the test pattern to provide an estimation for the etch-ending point of the actual structure has several problems. First, it has an inherent risk of inaccuracy of the etch-ending point for the actual structure, and such inaccuracy usually causes failures of the manufacturing process.

In addition, due to the large size of the test pattern involved and the large amount of the chemical material (such as the etchants) required, the whole manufacturing process becomes very complicated and expensive.

Furthermore, the structure is taken out of the etching bath or chamber one by one to either determine the color and surface tension, or measure the thickness with the meter, thereby increasing the processing time. Usually, the processing time using the conventional methods is similar to that required for etching a material with a thickness corresponding to 150–200% of the thickness of a target material.

Therefore, the conventional etch-ending point measuring methods for the wet etch and the vapor etch processes are not as effective in various aspects as the measuring method for the dry etch process. Consequently, an effective etch-ending point measuring method for the vapor etch and the wet etch processes is needed

SUMMARY OF THE INVENTION

Accordingly, the present invention is directed to an etch-ending point measuring method for a vapor etch process that substantially obviates one or more of the problems, limitations, and disadvantages of the related art.

An object of the present invention is to provide an etch-ending point measuring method for a vapor etch process with reduced risk of failure and lower cost.

Another object of the present invention is to provide an etch-ending point measuring method that can be performed within a shorter period of time compared to the conventional method.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the etch-ending point measuring method of the present invention includes the steps of providing a vapor-state etchant in a chamber, performing a vapor etch process by inserting a material to be etched in the chamber, measuring an ion current intensity value of a by-product generated during the vapor etch process, calculating a thickness variation value of the material by using the ion current intensity value, and stopping the vapor etch process when the thickness variation value reaches a preset value.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

A preferred embodiment of the present invention will now be explained with reference to FIG. 1, which shows the sequence of an etching-ending point measuring method for a vapor etch process in accordance with the present invention.

Figure 1:
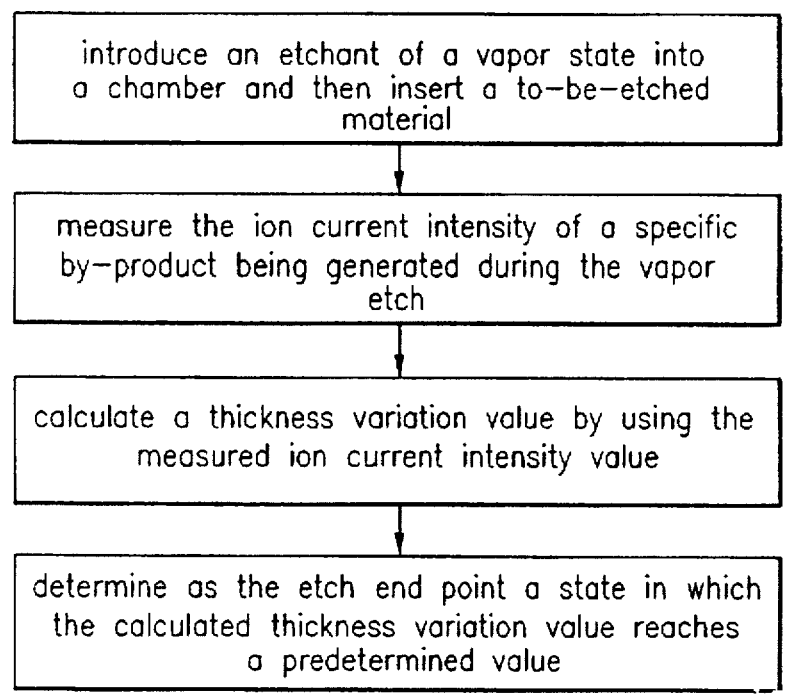
FIG. 1 is a block diagram showing an etch-ending point measuring method for a vapor etch process according to the present invention.

As shown in FIG. 1, a vapor-state etchant is first introduced into an etching chamber. Then, a material that is to be subjected to the etch process is inserted into the etching chamber. During the vapor etching process, the ion current intensity value of a specific by-product of the etching process is measured.

Different ion current intensity values of the specific by-product correspond to different etched thickness values of the material, and these corresponding (e.g. one-to-one) relationships are measured and recorded in a table according to previous experiments. Thus, the etched thickness value $\Delta T$ (also referred to as the thickness variation) of the material is determined by using the measured ion current intensity value. This etched thickness value $\Delta T$ is then displayed continuously or discretely by a display device. When the $\Delta T$ value displayed on the display device matches a predetermined value corresponding to the etch-ending point, the vapor etch process is completed.

Figure 2:
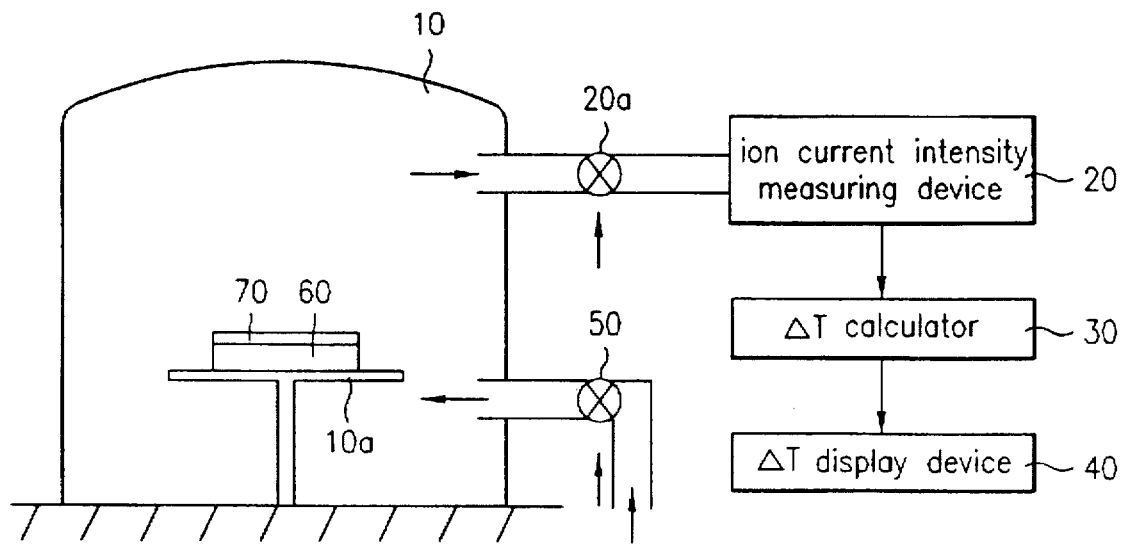
FIG. 2 is a schematic construction view showing a vapor etching apparatus for embodying the etch-ending point measuring method according to the present invention.

FIG. 2 is a schematic diagram showing a vapor etching apparatus for embodying the etch-ending point measuring method in accordance with the present invention. In FIG. 2, a reference numeral 10 denotes an etch chamber, and 10a is a stage for placing a material that is to be subjected to the etch process thereon. Numeral 20 is a measuring device for measuring the ion current intensity of a specific by-product generated during the vapor etch process, and 20a is a valve for controlling the amount of the specific by-product that is introduced into the measuring device 20. Numeral 30 is a $\Delta T$ calculator for calculating the etched thickness value $\Delta T$ (thickness variation) of the material corresponding to the measured ion current intensity value. Numeral 40 is a $\Delta T$ display device for displaying the calculated thickness variation $\Delta T$ on a monitor. Numeral 50 is another valve for controlling the amount of vapor-state etchant that is introduced into the chamber 10. In addition, reference numeral 60 denotes a silicon substrate, and 70 is an oxide layer such as silicon dioxide subjected to the etch process that is formed on the silicon substrate 60.

The process for vapor etching the silicon oxide layer will now be explained with reference to FIG. 2. First, anhydrous-state (i.e., vapor-state) HF is introduced into the etch chamber as an etchant through the valve 50. Then, a proper amount of vapor-state $H_2O$ is introduced into the chamber 10. Next, the silicon oxide layer 70 (formed on the silicon substrate 60) is placed on the stage 10a located at a predetermined portion of the etch chamber 10.

In the preferred embodiment, anhydrous-state HF is used as the etchant. Other anhydrous state etchants may also be used such as $H_3PO_4$ and $NH_4OH$, for etching the silicon oxide layer. Anhydrous $H_2SO_4$ may be used to etch a silicon semiconductor layer. One common characteristic of all the etchants listed above is that they all contain hydrogen ions.

In the preferred embodiment, the silicon oxide layer 70 may be a thermal oxide layer formed on the silicon substrate 60. A certain amount of vapor-state $H_2O$ is added to the vapor-state etchant HF during the vapor etching of the silicon oxide layer 70. Consequently, the etch rate of the silicon oxide layer 70 varies with the amount of H$_2$O added.

Figure 3A:
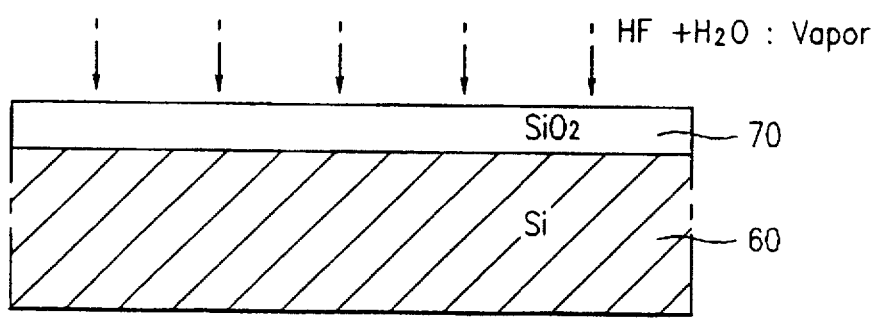
FIGS. 3a through 3d are cross sectional views showing the sequential etching process of a silicon oxide layer through a vapor etch process according to the present invention.
Figure 3B:
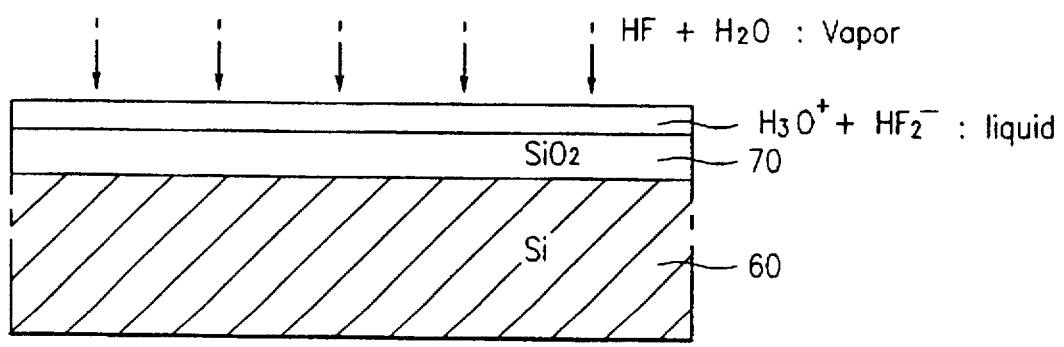
Figure 3C:
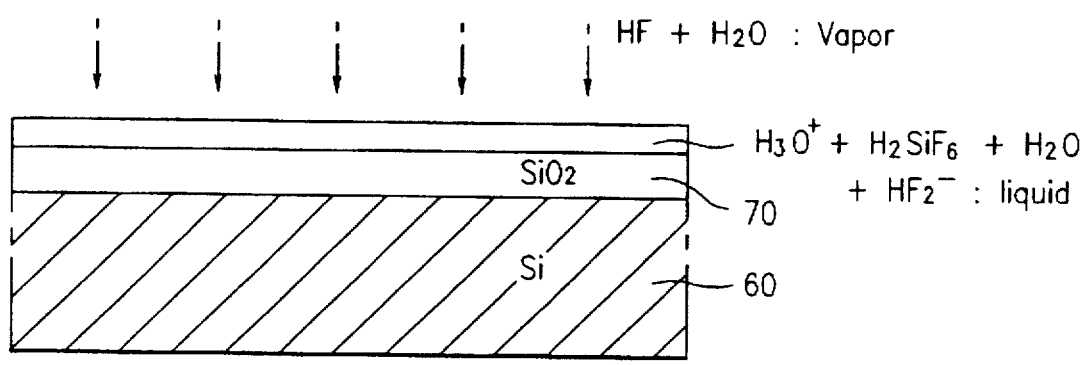

FIGS. 3a through 3d are cross sectional views showing the vapor etching process of the silicon oxide layer 70. As shown in FIG. 3a, when the vapor-state HF and H$_2$O are initially introduced into the etch chamber 10, they react with each other according to the following chemical formula:

$$2HF+H_2O \rightarrow H_3O^+ + HF_2^- \quad (1)$$

where (H$_3$O$^+$+HF$_2^-$) is in a liquid state and exists on the surface of the silicon oxide layer 70, as shown in FIG. 3b. Then, (H$_3$O$^+$+HF$_2^-$) reacts with the silicon oxide layer 70, thus etching the silicon oxide layer 70. As shown in FIG. 3c, during the etching of the silicon oxide layer 70, (H$_3$O$^+$+ H$_2$SiF$_6$+H$_2$O+HF$_2^-$) in liquid state exists on the surface of the silicon oxide layer 70.

Figure 3D:
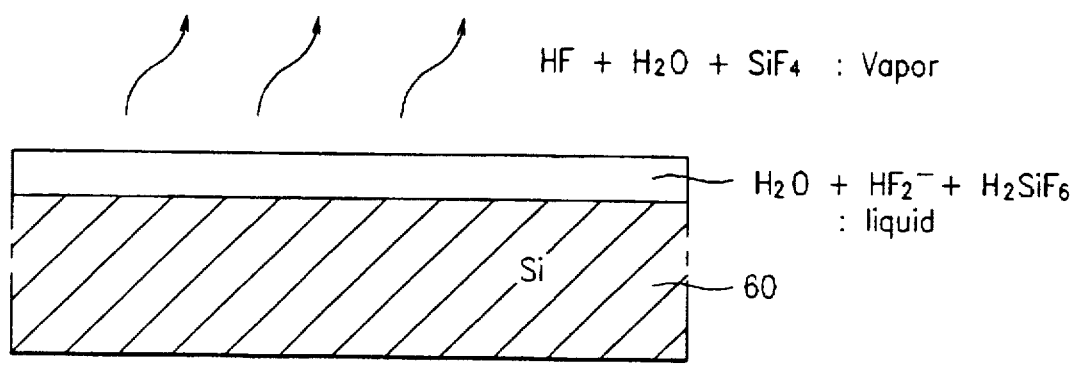

FIG. 3d shows a fully etched state of the silicon oxide layer 70. When the silicon oxide layer 70 is fully etched, (HF+H$_2$O+SiF$_4$) in vapor state is generated, and (H$_2$SiF$_6$+ H$_2$O+HF$_2^-$) in liquid state exists on the surface of the silicon substrate 60.

The reaction in FIGS. 3b through 3d can be shown in the following chemical formula:

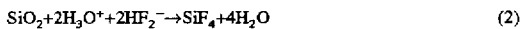

$$SiO_2 + 2H_3O^+ + 2HF_2^- \rightarrow SiF_4 + 4H_2O \quad (2)$$

The above formula (2) shows that the by-product SiF$_4$ is generated by the etching reaction between the silicon oxide layer 70 and the vapor mixture of HF/H$_2$O.

Figure 4:
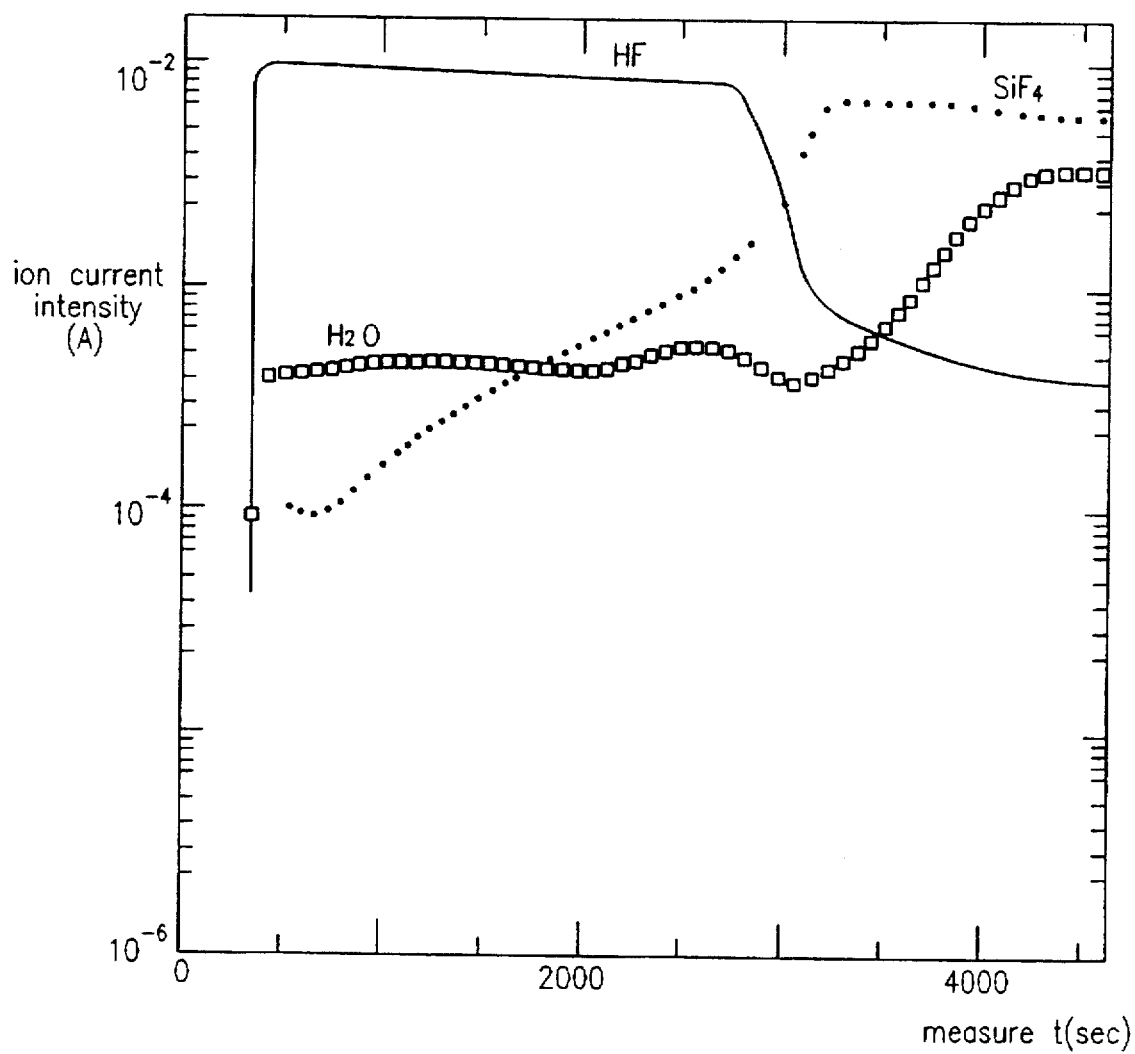
FIG. 4 is a graph showing ion current intensity values for the respective by-products generated during the etching process of a thermal silicon oxide at room temperature.

FIG. 4 shows the ion current intensity values of the respective by-products generated during the etching process of the thermal silicon oxide layer 70 at room temperature. As shown in FIG. 4, with the lapse of a predetermined time (about 500 seconds in FIG. 4) after starting the vapor etch, the by-products are generated and the ion current intensity values of the respective by-products are measured. This measurement is done in a manner such that the measuring device 20 (see FIG. 2) continuously or discretely captures only a specific by-product such as SiF$_4$ and measures its ion current intensity.

As shown in FIG. 4, with a lapse of about 500 seconds after starting the vapor etch, the ion current intensity value of the by-product SiF$_4$ continuously increases to a maximum point, and it then slowly decreases with a lapse of about 300 seconds. This maximum point corresponds to a state where the silicon oxide layer 70 is fully etched. This fact is ascertained through prior experiments. The variation value of the ion current intensity ($\Delta$ICI) of the by-product SiF$_4$, and the thickness variation value ($\Delta$T) of the silicon oxide layer 70 can be written in a table with a one-to-one corresponding relationship by using the results from such prior experiments. This table is then stored in a memory (not shown) in the $\Delta$T calculator 30 (see FIG. 2) for determining the thickness variation value ($\Delta$T) of the silicon oxide layer 70 based on the measured $\Delta$ICI value.

Thus, when the measuring device 20 measures the ion current intensity of SiF$_4$ either continuously or discretely, the $\Delta$T calculator 30 calculates the corresponding thickness variation value $\Delta$T (i.e., the etched thickness) of the silicon oxide layer 70. The calculated $\Delta$T value is then displayed by the $\Delta$T display device 40.

Accordingly, the $\Delta$T display device 40 displays the $\Delta$T value continuously or discretely on the monitor during the vapor etching of the silicon oxide layer 70. When the $\Delta$T value displayed by the $\Delta$T display device 40 reaches a predetermined value corresponding to the etch-ending point, the vapor etch process is completed.

In the present preferred embodiment, the material subjected to the etch process is a silicon oxide layer. Similarly, the etch-ending point measuring method of the present invention can be applied to a vapor etch process of a nitride insulating layer, a polysilicon semiconductor layer, or a metal layer. When a different material is subjected to the vapor etching, only the etchant and the specific by-product (selected to measure the ion current intensity) are different from that of the above-described embodiment. For example, if a polysilicon layer is etched, a different by-product is generated because anhydrous H$_2$SO$_4$ is used as an etchant.

The present invention has the following advantages. First, since the present invention is an automatic etch-ending point measuring method, instead of a visual measuring method, it is more convenient and enables the etching process to be performed within a shorter period of time than the conventional methods.

Second, the present invention is cost effective because an enlarged test pattern is not required. This prevents unnecessary consumption of the chemical etchant and the material to be etched.

Third, the etch-ending point is more accurately measured using the method in the present invention than the conventional methods, thus preventing possible failures during the vapor etch process.

It will be apparent to those skilled in the art that various modifications and variations can be made in the etch-ending point measuring method of the present invention without departing from the spirit or scope of the invention. Thus, it is intended that the present invention cover the modifications and variations of this invention provided they come within the scope of the appended claims and their equivalents.

What is claimed is:

1. A method for determining an etch-ending point using a vapor etch apparatus having a chamber, the method comprising the steps of:

providing a vapor-state etchant in the chamber, the vapor-state etchant containing hydrogen ions;

inserting a material to be etched in the chamber and etching the material by the etchant, the material being one of a silicon oxide layer and a silicon semiconductor layer;

measuring an ion current intensity of a by-product generated during the vapor etch process;

calculating a thickness variation value of the material by using the ion current intensity value; and stopping the vapor etch process when the thickness variation value reaches a preset value.

2. The method as claimed in claim 1, wherein the step of providing the vapor-state etchant includes the step of introducing vapor-state H$_2$O into the chamber together with the vapor-state etchant.

3. The method as claimed in claim 1, wherein the material to be etched includes a silicon oxide layer, the vapor-state etchant includes HF, and the by-product includes SiF$_4$.

4. The method as claimed in claim 1, wherein the vapor-state etchant includes one of HF, H$_3$PO$_4$, and NH$_4$OH, and the material includes a silicon oxide layer.

5. The method as claimed in claim 1, wherein the material to be etched includes a silicon semiconductor layer and the vapor-state etchant includes anhydrous H$_2$SO$_4$.

6. The method as claimed in claim 1, wherein the ion current intensity value is measured continuously.

7. The method as claimed in claim 1, wherein the ion current intensity value is measured discretely.

8. A method for measuring an etch-ending point for a vapor etch process of a material using an etchant, the method comprising the steps of:

providing a vapor-state HF in a chamber;

inserting a silicon oxide layer to be etched in the chamber and etching the silicon oxide layer by the vapor-state HF;

measuring an ion current intensity value of a by-product $SiF_4$ generated during the vapor etch process;

calculating a thickness variation value of the silicon oxide layer by using the ion current intensity value; and determining an etch-ending point when the thickness variation value reaches a preset value.

9. The method as claimed in claim 8, wherein the ion current intensity value is measured continuously.

10. The method as claimed in claim 8, wherein the ion current intensity value is measured discretely.

11. The method as claimed in claim 8, wherein the silicon oxide layer includes a thermal oxide layer formed on a silicon substrate.

12. The method as claimed in claim 8, further comprising the step of introducing vapor-state $H_2O$ into the chamber together with the vapor state HF.

13. A method for measuring an etch-ending point for a vapor etch process of a material using an etchant, the method comprising the steps of:

providing anhydrous $H_2SO_4$ in a chamber;

inserting a silicon semiconductor layer to be etched in the chamber and etching the silicon semiconductor layer by the anhydrous $H_2SO_4$;

measuring an ion current intensity value of a by-product generated during the vapor etch process;

calculating a thickness variation value of the silicon semiconductor layer by using the ion current intensity value; and stopping the vapor etch process when the thickness variation value reaches a preset value.

14. The method as claimed in claim 13, wherein the ion current intensity value is measured continuously.

15. The method as claimed in claim 13, wherein the ion current intensity value is measured discretely.

16. The method as claimed in claim 13, further comprising the step of introducing vapor-state $H_2O$ into the chamber together with the anhydrous $H_2SO_4$.

* * * * *